United States Patent
Wang et al.

(10) Patent No.: US 8,456,101 B2
(45) Date of Patent: Jun. 4, 2013

(54) POWER SYSTEMS WITH PLATFORM-BASED CONTROLLERS

(75) Inventors: Yi-Ren Wang, Taipei (TW); Sheng-Tai Lee, Taipei (TW); Da Liu, Milpitas, CA (US); Chuan-Chiung Kuo, Taipei (TW)

(73) Assignee: O2Micro, Inc., Santa Clara, CA (US)

( * ) Notice: Subject to any disclaimer, the term of this patent is extended or adjusted under 35 U.S.C. 154(b) by 344 days.

(21) Appl. No.: 12/757,239

(22) Filed: Apr. 9, 2010

(65) Prior Publication Data

US 2010/0264844 A1      Oct. 21, 2010

Related U.S. Application Data

(60) Provisional application No. 61/170,274, filed on Apr. 17, 2009.

(51) Int. Cl.
    *G05F 1/00* (2006.01)
(52) U.S. Cl.
    USPC .......................................................... 315/291
(58) Field of Classification Search
    USPC .. 315/291, 307, 224, 246, 209 R; 363/15–16, 363/21.02, 21.09, 34; 257/114, 293, 676, 257/777
    See application file for complete search history.

(56) References Cited

U.S. PATENT DOCUMENTS

| | | | |
|---|---|---|---|
| 5,872,429 A * | 2/1999 | Xia et al. | 315/194 |
| 6,144,571 A | 11/2000 | Sasaki | |
| 6,940,724 B2 * | 9/2005 | Divakar et al. | 361/719 |
| 7,095,099 B2 * | 8/2006 | Oliver et al. | 257/676 |
| 7,222,243 B2 | 5/2007 | Kirker et al. | |
| 7,403,399 B2 * | 7/2008 | Morbe et al. | 361/820 |
| 7,423,386 B2 * | 9/2008 | Radzinski et al. | 315/247 |
| 7,515,445 B2 * | 4/2009 | Lin | 363/98 |
| 7,515,446 B2 * | 4/2009 | Lin | 363/98 |
| 7,564,704 B2 * | 7/2009 | Rozsypal et al. | 363/56.1 |
| 2001/0008483 A1 | 7/2001 | Lee et al. | |

FOREIGN PATENT DOCUMENTS

| | | |
|---|---|---|
| CN | 1306385 A | 8/2001 |
| CN | 1356764 A | 7/2002 |
| CN | 1384590 A | 12/2002 |
| JP | 2000245170 A | 9/2000 |
| JP | 2007-318954 A | 12/2007 |

* cited by examiner

*Primary Examiner* — Minh D A

(57) ABSTRACT

A power system includes a switching circuit, a resonant tank, a feedback circuit, and controller circuitry. The switching circuit including a first switch and a second switch provides a first AC signal. The resonant tank coupled to the switching circuit receives the first AC signal and generating a second AC signal for powering a load. The feedback circuit coupled to the load monitors an electrical condition of the load and provides a feedback signal. The controller circuitry coupled to the converter controls the switching circuit according to the feedback signal so as to control the power to the load. The controller circuitry is integrated in a first die. The first switch is integrated in a second die, and the second switch is integrated in a third die. The first die, said second die and said third die are mounted on and electrically interconnected to a platform compatible with through-hole technology. The platform and the resonant tank are further assembled on a printed circuit board.

11 Claims, 11 Drawing Sheets

PLARFORM-BASED ARCHITECTURE

IC-BASED ARCHITECTURE

PLARFORM-BASED ARCHITECTURE

POWER SYSTEMS WITH PLATFORM-BASED CONTROLLERS

RELATED APPLICATION

This application claims priority to U.S. Provisional Application No. 61/170,274, filed on Apr. 17, 2009, which is hereby incorporated by reference in its entirety.

BACKGROUND ART

A power conversion system, e.g., an inverter system for converting DC power to AC power can include a controller circuit, a feedback circuit, switch elements, and a resonant tank. Conventional architectures for the inverter systems have dice-based architectures or integrated circuit (IC)-based architectures.

In a dice-based architecture, discrete dice are packaged into discrete ICs respectively and then assembled on a printed circuit board (PCB). The controller circuit can be integrated in a surface-mounted IC package. The switch elements are active semiconductor devices and each switch element is integrated in a separate surface-mounted IC package. The feedback circuit can include discrete components such as resistors, capacitors and diodes which are also integrated in respective discrete surface-mounted packages. Surface-mounted packages generally refer to electronic circuits in which the components are mounted directly onto the surface of PCBs. The resonant tank includes a transformer and capacitors, which are available in through-hole packages. Through-hole packages refer to components having pins that are inserted into holes drilled in PCBs and soldered to pads on the opposite side. In the dice-based architecture, each element is mounted on a PCB and interconnected by metal traces on the PCB. The PCB may include other components or devices such as an AC-DC power supply system for converting an AC voltage to a regulated DC voltage, which can be used by the inverter system and other subsystems. Due to the nature of the power conversion, the AC-DC power supply system usually includes through-hole devices.

As shown in FIG. 1, multiple ICs 102 and 104 (e.g., an IC integrating the controller circuit and other ICs integrating the switches respectively) and other discrete components 110 (e.g., resistors, capacitors, and diodes) are assembled on the same PCB 120 through the assembly process. However, in the dice-based architecture, since the elements such as the controller circuit and switches are packaged in individual ICs, the overall all PCB size is relatively large, thereby increasing the cost of the PCB. Moreover, since both surface-mounted devices and through-hole devices are used on the same PCB, the PCB will undergo soldering process twice, i.e., one for though-hole devices and another for surface mount devices. The repetitive exposure to relatively high temperature in a solder process may degrade the reliability of the system. Consequently, manufacturing cost may be further increased due to additional effort to manage both surface mount and through-hole assembly technology. Manufacturing time can be prolonged due to repetitive soldering process.

In an IC-based architecture, the controller circuit and the switch elements are integrated in the same IC chip. For example, as shown in FIG. 2, an IC 202 integrating the controller circuit and the switches and other discrete components 210 (e.g., resistors, capacitors, and diodes) can be assembled on a PCB 220 through the assembly process. However, such IC-based architecture can be limited by the power rating of the internally integrated switch elements. To support applications with greater power ratings, the IC 202 integrating the controller circuitry and the switch elements may need to be re-designed and taped-out. In case of redesign and tape-out, the pin-out and IC package size may be changed. Furthermore, as both surface-mounted devices and through-hole devices are used on the PCB, the aforementioned problems associated with mixed surface-mounted and through-hole assembly process still remain unsolved.

SUMMARY

A power system includes a switching circuit, a resonant tank, a feedback circuit, and controller circuitry. The switching circuit including a first switch and a second switch provides a first AC signal. The resonant tank coupled to the switching circuit receives the first AC signal and generating a second AC signal for powering a load. The feedback circuit coupled to the load monitors an electrical condition of the load and provides a feedback signal. The controller circuitry coupled to the converter controls the switching circuit according to the feedback signal so as to control the power to the load. The controller circuitry is integrated in a first die. The first switch is integrated in a second die, and the second switch is integrated in a third die. The first die, said second die and said third die are mounted on and electrically interconnected to a platform compatible with through-hole technology. The platform and the resonant tank are further assembled on a printed circuit board.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION

Figure 1:
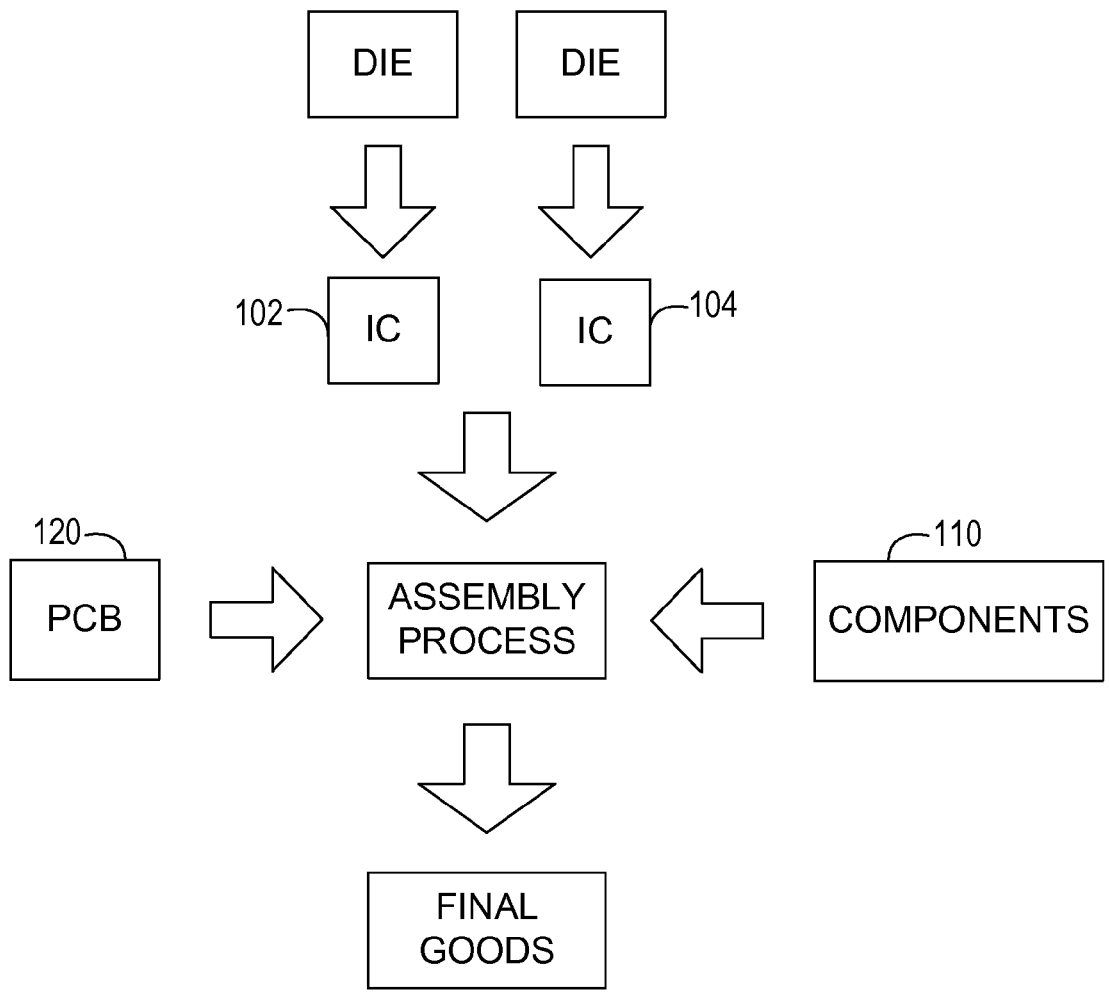
FIG. 1 shows a conventional dice-based architecture for a power conversion system.
Figure 2:
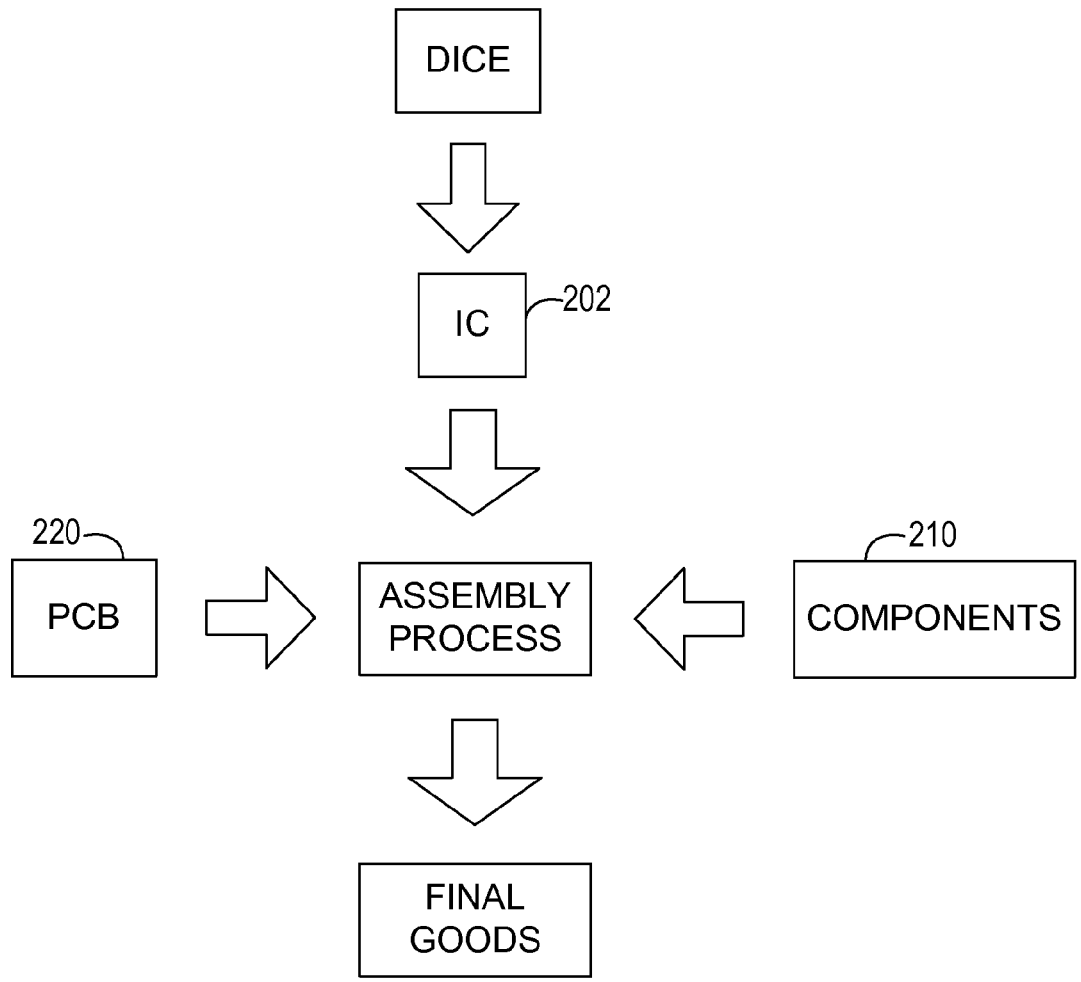
FIG. 2 shows a conventional IC-based architecture for a power conversion system.

Reference will now be made in detail to the embodiments of the present invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "integrating," "mounting," "attaching" or the like, refer to actions and processes of semiconductor device fabrication.

It is understood that the figures are not drawn to scale, and only portions of the structures depicted, as well as the various layers that form those structures, are shown. Furthermore, other fabrication processes and steps may be performed along with the processes and steps discussed herein; that is, there may be a number of process steps before, in between and/or after the steps shown and described herein. Importantly, embodiments of the present invention can be implemented in conjunction with these other (perhaps conventional) processes and steps without significantly perturbing them. Generally speaking, the various embodiments of the present invention can replace portions of a conventional process without significantly affecting peripheral processes and steps.

Embodiments in accordance with the present invention provide a platform-based architecture used in power conversion systems, e.g., inverter systems. The power conversion system includes a platform-based controller in which multiple dice (e.g., a die integrating controller circuitry and dice integrating switches respectively) and other discrete components (e.g., resistors, capacitors and diodes from a feedback circuit) are mounted on a platform, e.g., a printed-circuit-board-based platform or substrate-based platform. The flexibility of the power conversion system can be enhanced. Moreover, the platform-based controller can be assembled with more components (e.g., resonant tank) on a PCB with a relatively small size. Since both of the platform-based controller and the resonant tank are compatible with the through-hole technology, surface mount assembly process can be omitted. In addition, the reliability of the power conversion system can be improved because components in the power conversion system need not go through excessive reflow and soldering process.

Figure 3:
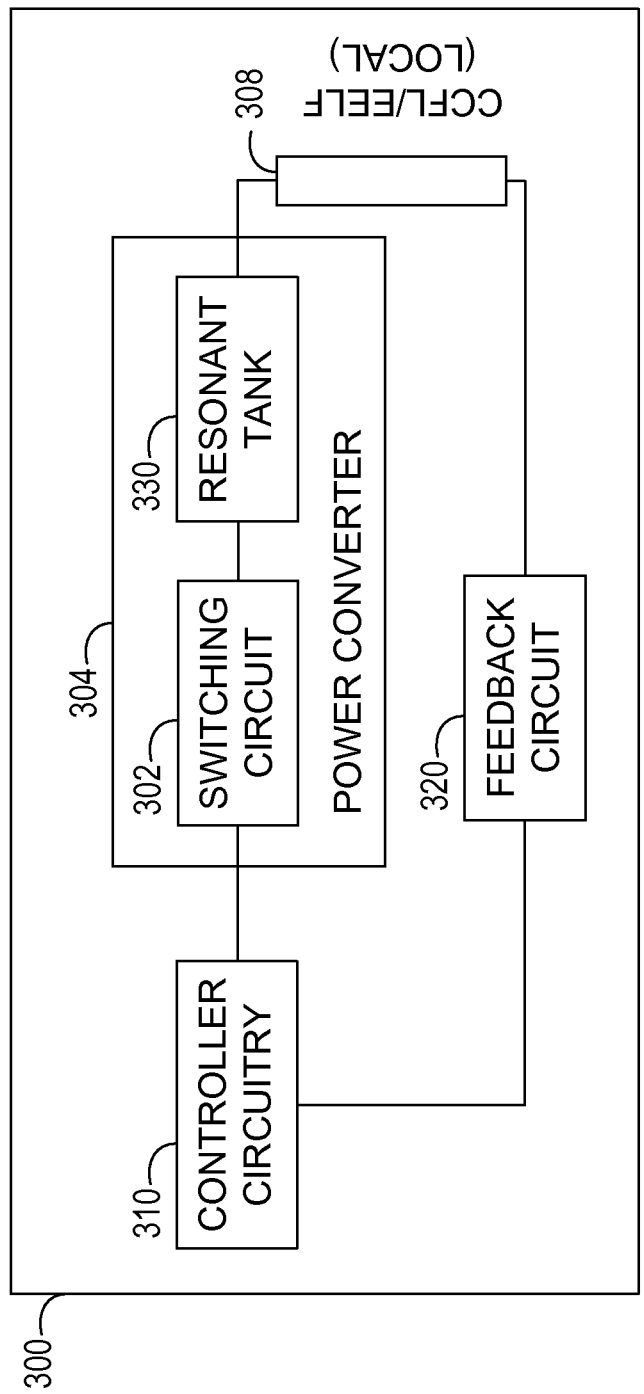
FIG. 3 shows an inverter system for powering a load, e.g., a cold cathode fluorescent lamp (CCFL), in accordance with one embodiment of the present invention.

FIG. 3 shows a power system, e.g., an inverter system 300 for powering a load, in accordance with one embodiment of the present invention. In the example of FIG. 3, the inverter system 300 includes controller circuitry 310, a DC-AC power converter 304 including a switching circuit 302 and a resonant tank 330, a feedback circuit 320, and a light source 308 (e.g., a cold cathode fluorescent lamp (CCFL)). The inverter system 300 is operable for converting a DC voltage to an AC voltage to power the light source 308. The switching circuit 302 including one or more switches is operable for providing an AC signal to the resonant tank 330. The resonant tank 330 including a transformer and capacitors receives the AC signal from the switching circuit 302 and generates a step-up AC signal to power the light source 308.

The feedback circuit 320 coupled between the light source 308 and the controller circuitry 310 is operable for monitoring an electrical condition of the load, e.g., a current and/or a voltage of the light source 308, and for sending the feedback signal indicative of the electrical condition to the controller circuitry 310. The feedback circuit 320 can also detect undesirable or abnormal fault conditions, e.g., over-voltage, over-current, short-circuit, open-lamp conditions, of the light source 308 to enable protection functions. The controller circuitry 310 receives the feedback signal from the feedback circuit 320 and controls the switches in the switching circuit 302 according to the feedback signal so as to control the power to the light source 308. The controller circuitry 310 may include a controller IC and other application-related components. The switching circuit 302 can have a half-bridge configuration, a full-bridge configuration, or the like. The switches in the switching circuit 302 are switched on and off by the controller circuitry 310.

Figure 4:
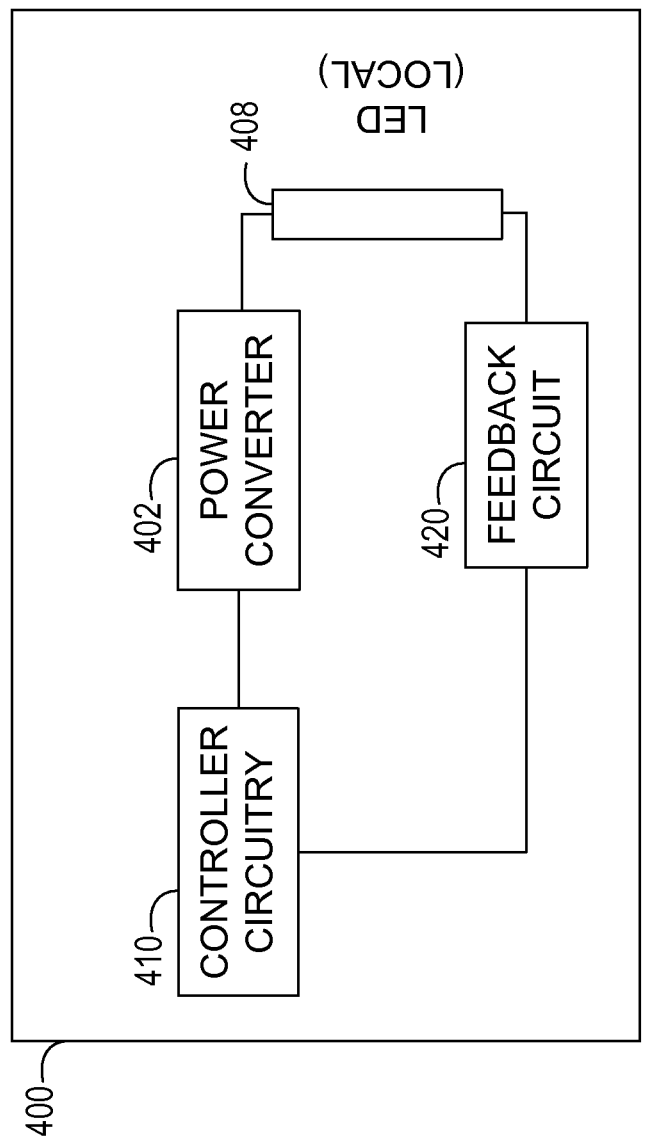
FIG. 4 shows a power system for powering a load, e.g., a light-emitting diode (LED), in accordance with one embodiment of the present invention.

FIG. 4 shows a power system 400 for powering a load, e.g., a light-emitting diode (LED), in accordance with one embodiment of the present invention. The power system 400 does not require a resonant tank since the LED can be powered by DC power directly.

In the example of FIG. 4, the power system 400 includes controller circuitry 410, a DC-DC power converter 402, a feedback circuit 420, and one or more LEDs 408. The feedback circuit 420 is operable for monitoring an electrical condition, e.g., a current and/or a voltage of the LEDs 408 and providing a feedback signal indicative of the electrical condition of the LEDs 408 to the controller circuitry 410. The feedback circuit 420 can also detect undesirable or abnormal fault conditions, e.g., over-voltage, over-current, short-circuit, open-lamp conditions, of the LEDs 408 to enable protection functions. The controller circuitry 410 receives the feedback signal from the feedback circuit 420 and controls one or more power switches in the DC-DC converter 402 accordingly so as to control the DC power to the LEDs 408.

Figure 5:
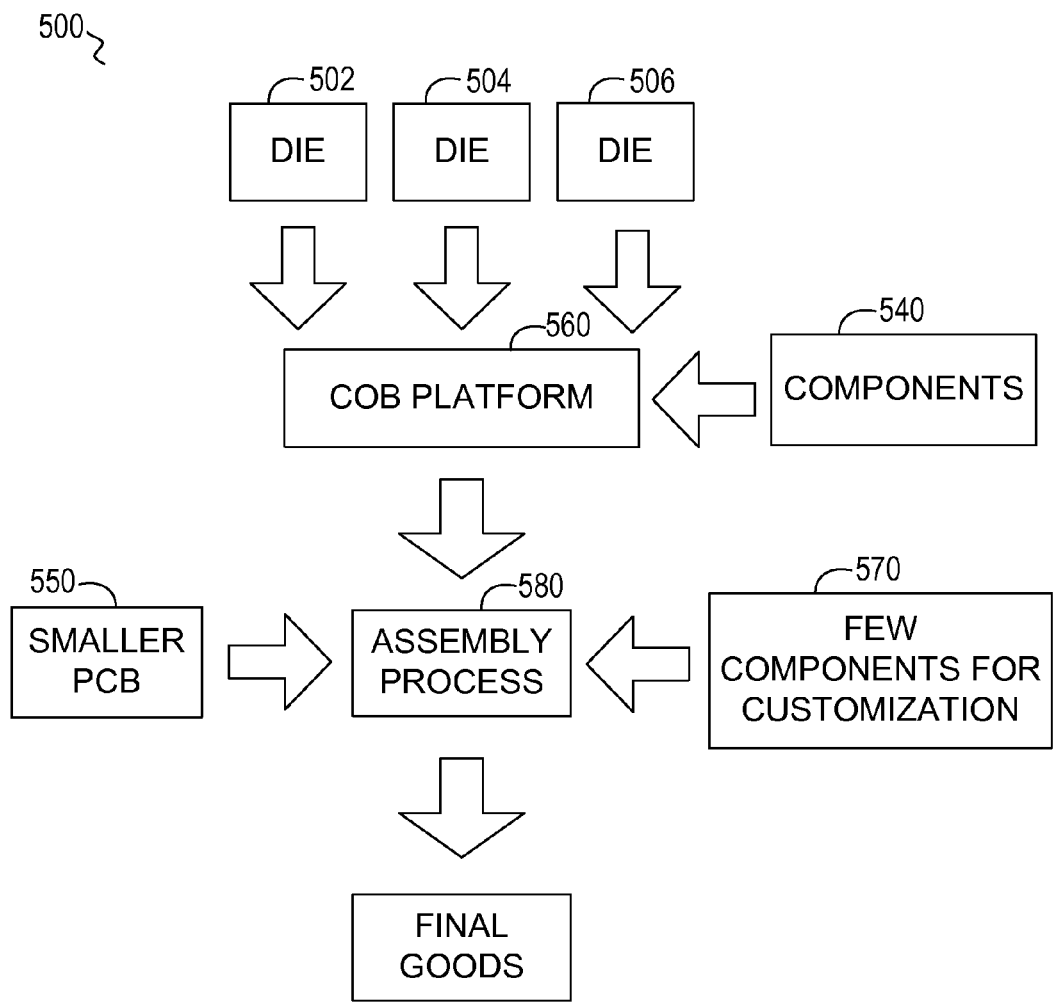
FIG. 5 shows a platform-based architecture for a power conversion system, in accordance with one embodiment of the present invention.

FIG. 5 shows a platform-based architecture 500, in accordance with one embodiment of the present invention. By way of example, FIG. 5 is described in combination with FIG. 3 and FIG. 4. The platform-based architecture 500 can be used in the inverter system 300 or the power system 400. However, the invention is not so limited; the platform-based architecture 500 can be well-suited in other power or electronic systems within the scope and spirit of the present invention.

As shown in FIG. 5, multiple dice, such as 502, 504 and 506 can be directly mounted on and electrically interconnected to a platform 560, e.g., a PCB-based platform or a substrate-based platform. The PCB-based platform can be an industry standard printed circuit board on which chips or dice are directly mounted. The substrate-based platform can be a substrate, e.g., ceramic, glass ceramic, or flex substrate, on which chips or dice are directly mounted. For a PCB-based platform, discrete components 540 such as resistors, capacitors, and diodes can also be mounted on the platform directly. Alternatively, for a substrate-based platform, discrete components 540 such as resistors, capacitors and diodes can be embedded in the platform, e.g., embedded in the substrate.

By way of example, for the inverter system 300 in FIG. 3, the die 502 integrates the controller circuitry 310, the die 504 integrates a first switch, e.g., a MOSFET in the switching circuit 302, and the die 506 integrates a second switch, e.g., a MOSFET in the switching circuit 302. Each switch in the switching circuit 302 is integrated in a die, in one embodiment. Other discrete components such as resistors, capacitors and diodes, e.g., from the feedback circuit 320, can also be mounted on the platform or embedded in the platform. Advantageously, the controller circuitry 310, the feedback circuit 320 and the switching circuit 302 are integrated on the same platform to constitute a platform-based controller.

Similarly, for the power system 400 in FIG. 4, the die 502 can integrate the controller circuitry 410, the die 504 can integrate a first switch, e.g., a MOSFET in the power converter 402, and the die 506 can integrate a second switch, e.g., a MOSFET in the power converter 402. Each switch in the power converter 402 can be integrated in a die. Other discrete components such as resistors, capacitors and diodes, e.g., from the feedback circuit 420 or the power converter 402, can also be mounted on the platform or embedded in the platform. Advantageously, the controller circuitry 410, the feedback circuit 420 and the power converter 402 can be integrated on the same platform to constitute a platform-based controller.

Advantageously, by attaching multiple dice (e.g., a die integrating controller circuitry and dice integrating switches) onto a platform, e.g., a PCB-based platform or substrate-based platform, several advantages can be achieved. First, the flexibility of the power conversion system is enhanced. For example, if the controller circuitry needs to be re-designed to accommodate new functions, the die integrating the controller circuitry can be replaced but the platform can remain unchanged. To support applications with different power ratings, the dice integrating switches from the switch elements can be substituted and customized based on customer's demand during a bonding stage. In other words, the platform-based controller can be well-suited in different applications and can meet different requirements by replacing one or more dice, and the platform can still remain unchanged.

Second, as the controller circuitry, switches and feedback circuit can be integrated as a stand-alone platform-based controller, the level of integration is increased compared to the conventional dice-based architectures and IC-based architectures. In one embodiment, the platform-based controller is compatible with through-hole technology.

Referring back to FIG. 5, once the platform-based controller is designed and manufactured, the platform-based controller can be assembled with other customized components 570 (e.g., a resonant tank 330) on a PCB 550 through the assembly process 580. As the level of integration is increased, the PCB 550 can have a smaller size compared to the PCBs in conventional dice-based architectures and IC-based architectures. Thus, the cost is further reduced.

Thus, the final goods, e.g., the PCB assembled with the platform-based controller and other components can be shipped to the customer. Alternatively, the platform-based controller can be shipped to the customer and the customer can further assemble the platform-based controller and other customized components (such as resonant tank) on the PCB.

Advantageously, since the platform-based controller can be compatible with through-hole technology, the customers can use the platform-based controllers as through-hole devices in their own systems/products, e.g., display systems, LCD televisions, or notebook computers. Moreover, making the platform-based controllers compatible with the through-hole technology can simplify customers' production flow (e.g., customer may use production line supporting through-hole technology only). Surface mount assembly process can be omitted. In addition, the reliability of the power conversion system is improved because components in the power conversion system do not need to go through excessive reflow and soldering process.

Figure 6:
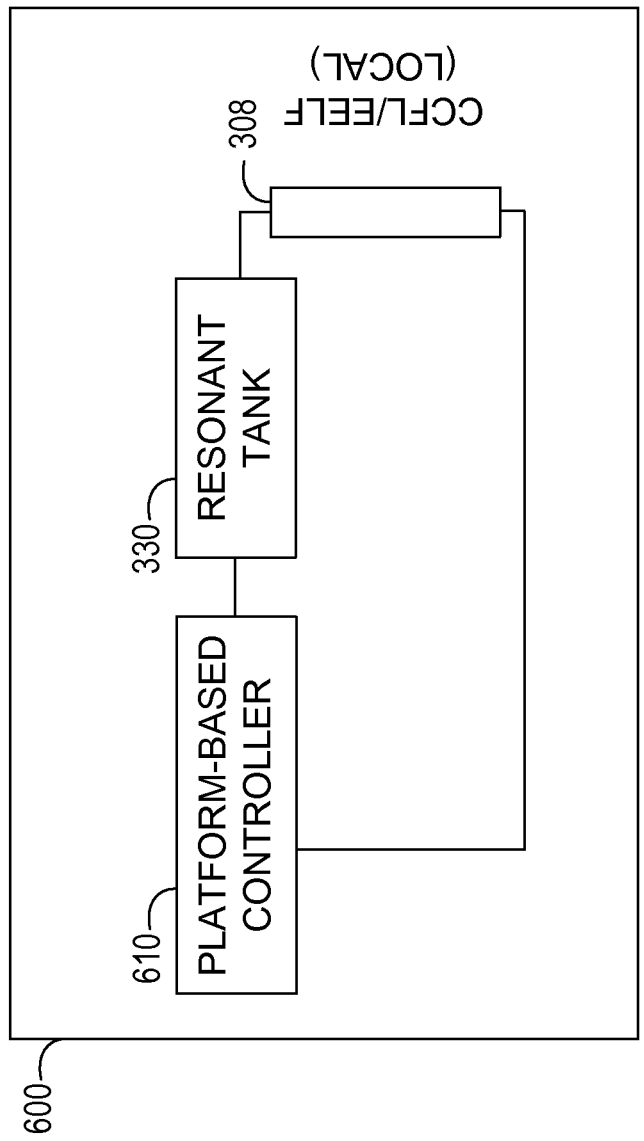
FIG. 6 shows an inverter system employing a platform-based controller, in accordance with one embodiment of the present invention.

For example, in FIG. 6, the platform-based controller 610 integrating the controller circuitry 310, the feedback circuit 320 and the switching circuit 302 is configured to convert DC power to AC power. In the platform-based controller 610, microchips or dice are directly mounted on and electrically interconnected to a platform, e.g., a PCB-based platform or a substrate-based platform. Advantageously, the platform-based controller 610 and the resonant tank 330 in the inverter system 600 can be assembled on a PCB to power the load 308. The overall PCB size is reduced. As both of the platform-based controller 610 and the resonant tank 330 are compatible with the through-hole technology, the surface mount assembly process can be omitted. In addition, the reliability of the inverter system 600 is improved because the PCB assembled with the platform-based controller 610 and the resonant tank 330 need not go through excessive reflow and soldering process.

Figure 7:
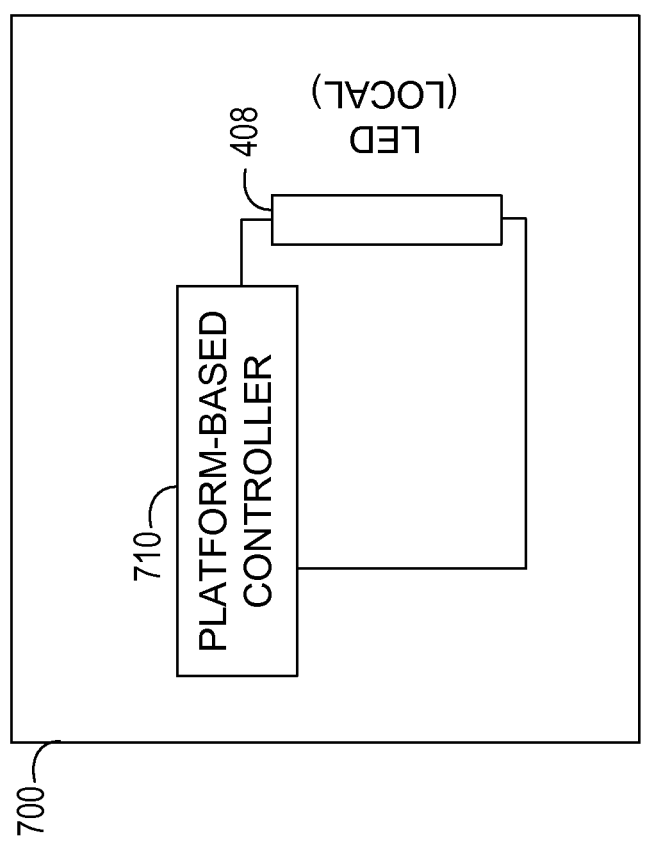
FIG. 7 shows a power system employing a platform-based controller, in accordance with one embodiment of the present invention.

FIG. 7 shows a power system 700, in accordance with one embodiment of the present invention. Similarly, the controller circuitry 410, the feedback circuit 420 and the power converter 402 in FIG. 4 can be integrated as a platform-based controller 710 as shown in FIG. 7, in accordance with one embodiment of the present invention. The platform-based controller 710 is configured to convert DC power to DC power. In the platform-based controller 710, microchips or dice are directly mounted on and electrically interconnected to a platform, e.g., a PCB-based platform or a substrate-based platform. In the example of FIG. 7, the platform-based controller 710 can directly power the load 408.

Figure 8A:
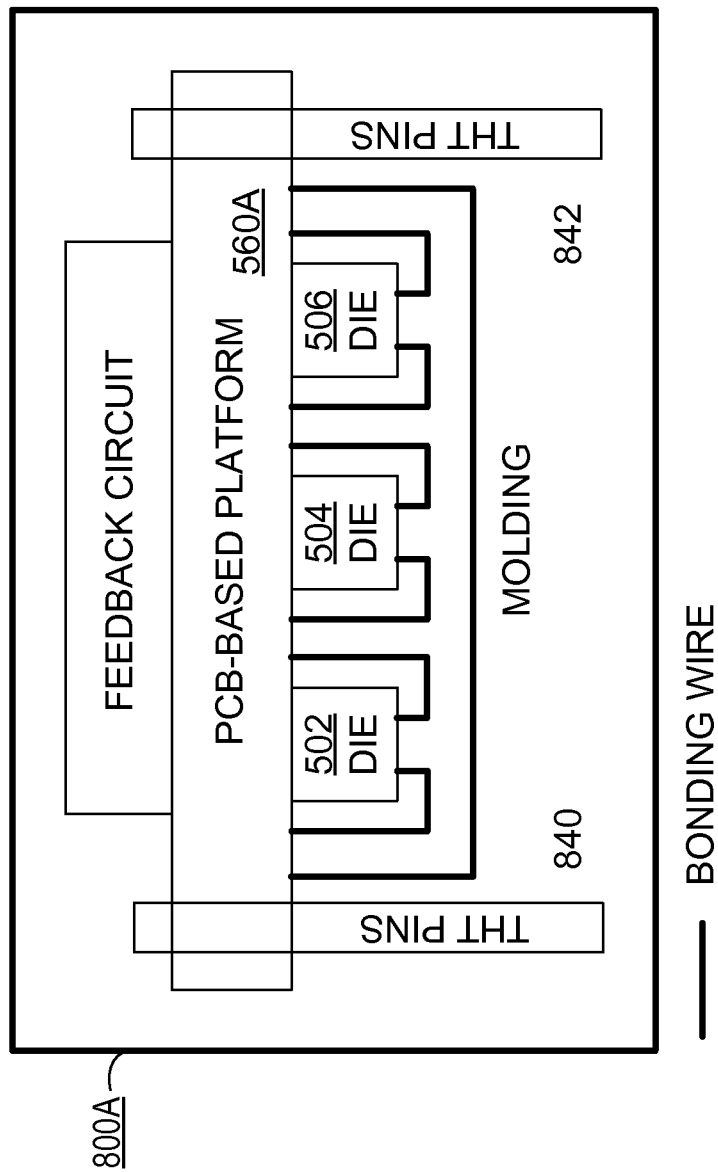
FIG. 8A shows a platform-based controller using a PCB-based platform, in accordance with one embodiment of the present invention.
Figure 8B:
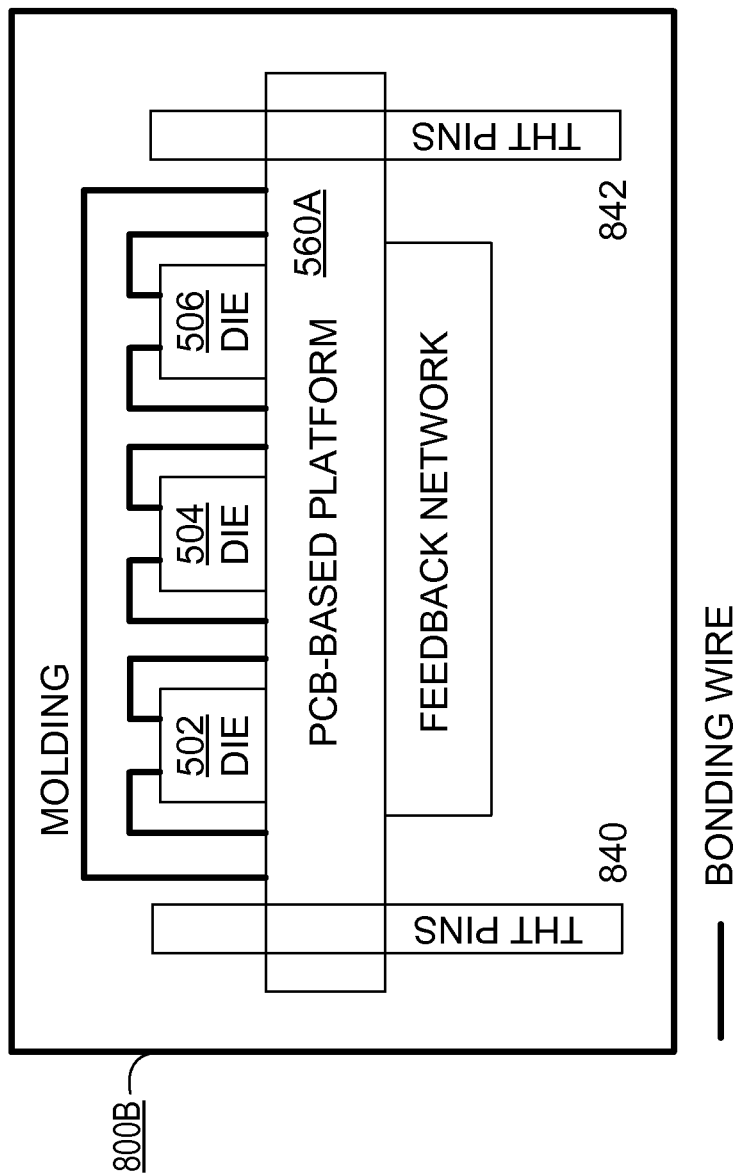
FIG. 8B shows a platform-based controller using a PCB-based platform, in accordance with another embodiment of the present invention.
Figure 8C:
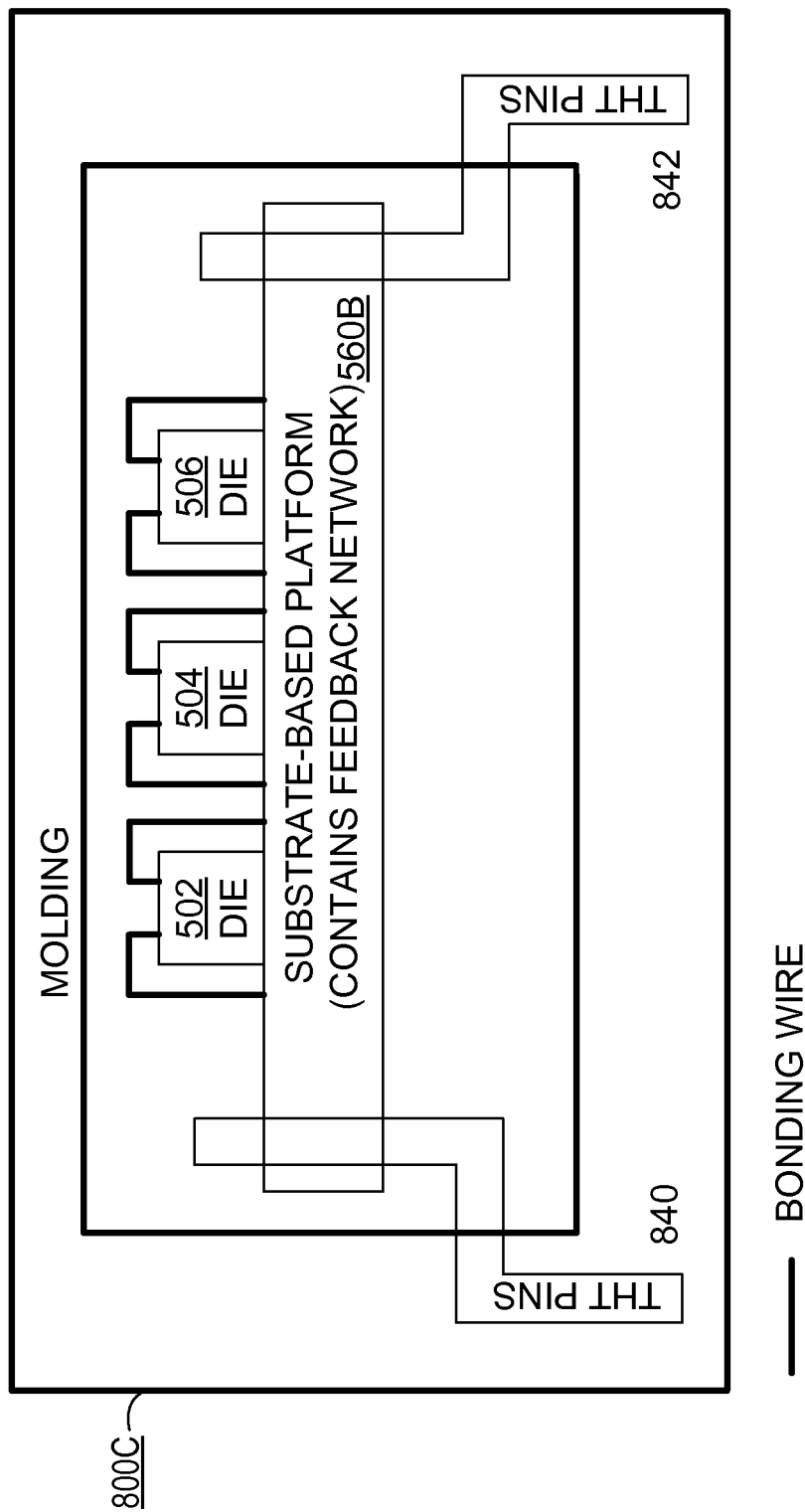
FIG. 8C shows a platform-based controller using a substrate-based platform, in accordance with one embodiment of the present invention.

FIG. 8A-FIG. 8C show different examples of a platform-based controller. The structures of the platform-based controller are not limited to the examples in FIG. 8A-8C. FIG. 8A shows a platform-based controller 800A employing a PCB-based platform, in accordance with one embodiment of the present invention. The platform-based controller 800A includes dice 502, 504 and 506, a PCB-based platform 560A, and THT pins 840 and 842. By way of example, the controller circuitry can be integrated in a die 502. A first switch, e.g., a MOSFET, can be integrated in a die 504. A second switch, e.g., a MOSFET, can be integrated in a die 506. Not all the dice are shown in FIG. 8A for purposes of clarity and brevity. The dice can be directly mounted on and electrically interconnected on the PCB-based platform 560A. Moreover, the feedback circuit including discrete components such as resistors, capacitors and/or diodes can be also directly mounted on the PCB-based platform 560A.

FIG. 8B shows a platform-based controller 800B employing a PCB-based platform, in accordance with another embodiment of the present invention. Labels labeled the same as in FIG. 8A have similar functions. FIG. 8B is similar to FIG. 8A except that the locations of the dice and the feedback circuit are exchanged.

FIG. 8C shows a platform-based controller 800C using a substrate-based platform, in accordance with another embodiment of the present invention. Labels labeled the same as in FIG. 8A and FIG. 8B have similar functions. In the example of FIG. 8C, the dice are directly mounted on and electrically interconnected on the substrate-based platform 560B. The feedback circuit including discrete components such as resistors, capacitors and/or diodes is embedded in the substrate-based platform 560B.

Figure 9:
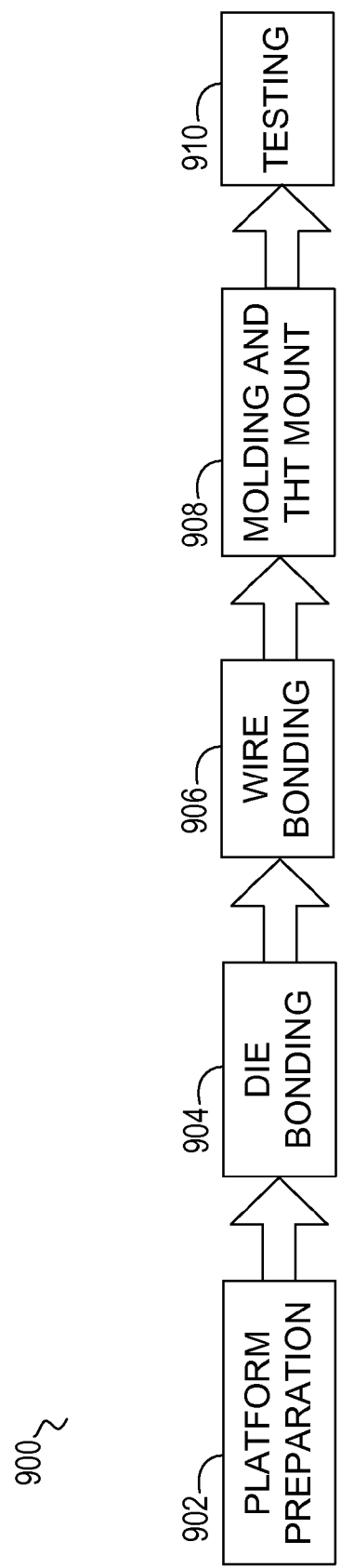
FIG. 9 shows a flowchart of production steps for a platform-based controller, in accordance with one embodiment of the present invention.

FIG. 9 shows a flowchart 900 of production steps for the platform-based controller, in accordance with one embodiment of the present invention. FIG. 9 is described in combination with FIG. 8A-FIG. 8C. In block 902, a platform is prepared and formed. Various packaging standards and methods compatible with the through-hole technology, such as DIP (dual in-line packages), can be used for the platform-based controller in the present invention. Particular types of packages can be chosen according to customer needs. In one embodiment, dual in-line packages (DIP) such as plastic dual in-line packages (PDIP), ceramic dual in-line packages (CERDIP), and shrink plastic dual in-line packages can be used for packaging the platform-based controller.

During platform preparation, package dimensions are determined. In one embodiment, the customer can determine a package that is compatible with the though-hole technology. Thus, the package dimensions can be determined based upon customer's selected package. For example, dimension parameters such as platform height, platform length, lead thickness, lead width, lead length, etc., are determined for the platform (PCB-based platform or substrate-based platform) of the platform-based controller. If the DIP packaging is used, dimension parameters are determined in accordance with the DIP standards.

Next, platform layout is done by layout tools. Additional layout techniques such as thermal via and thermal trace can be used to reduce power dissipation and enhance performance of the platform-based controller. If the platform is a substrate-based platform, some discrete components, e.g., the resistors, capacitors and diodes in the feedback circuit 320, will be embedded in the substrate-based platform. After the platform is manufactured, the platform is inspected for defects for purposes of quality control.

In block 904, dice are attached to or mounted on the PCB-based platform or the substrate-based platform. As discussed in relation to block 902, if the platform is a substrate-based platform, the discrete components in the feedback circuit are already built in the platform. However, if the platform is a PCB-based platform, the discrete components, e.g., the resistors, capacitors and diodes in the feedback circuit, are attached to or mounted on the PCB-based platform in block 904.

In one embodiment, die-bonding area for the controller circuitry and the switches are specified and prepared. Die attach adhesive is applied to the PCB-based platform or the substrate-based platform. Dice integrating the controller circuitry and the switches can be respectively attached to or amounted on the PCB-based platform or the substrate-based platform over the die attach material. Adhesive application may be in the form of dispensing, stencil printing or pin transfer, or the like. A curing process (e.g., exposure to hear or ultraviolet light) can be applied to allow the adhesive to attain its final mechanical, thermal and electrical properties.

In block 906, in the wire-bounding stage, interconnection between the platform and the dice/components are completed. Interconnections between the dice (or chips) are also completed. For example, thermosonic Au or Cu ball bonding or ultrasonic Al wedge bounding may be employed to connect wires between the die and the PCB-based platform or the substrate-based platform.

In block 908, the die and bond wires are encapsulated to protect them from mechanical and chemical damages (molding). Encapsulation can be done by dispensing a liquid encapsulate material over the die and wires or by transferring molding. Furthermore, through-hole pins (THT pins) are mounted on the platform-based controller.

In block 910, testing procedures are performed to screen out defective parts. Advantageously, in one embodiment, the dimension of the platform-based controller can be compatible with the dual in-line package (DIP) dimension. As a result, existing DIP testing equipment can be used to test the platform-based controller.

Thus, the platform-based controllers can be designed and manufactured according to customer needs/requirements. The manufacturing process of the platform-based controllers, which may involve "clean room class 100K" (a clean room has a controlled level of contamination that is specified by the number of particles per cubic meter at a specified particle size), can be transparent to the customers.

Accordingly, embodiments in accordance with the present invention provide a platform-based architecture that can be used in power conversion systems (e.g., inverter systems). Although the embodiments are discussed in the context of the light source power system, the invention is not so limited and can be used in various types of power systems. Advantages of the present invention include, but are not limited to, increased design and application flexibility, reduced size and cost, and enhanced system reliability.

What is claimed is:

1. A power system comprising:
   a switching circuit operable for providing a first AC signal and comprising a first switch and a second switch; and
   a resonant tank coupled to said switching circuit and operable for receiving said first AC signal and generating a second AC signal for powering a load,
   a feedback circuit coupled to said load and operable for monitoring an electrical condition of said load and for providing a feedback signal; and
   controller circuitry coupled to said switching circuit and operable for controlling said switching circuit according to said feedback signal so as to control said power to said load,
   wherein said controller circuitry is integrated in a first die, said first switch is integrated in a second die, said second switch is integrated in a third die, and wherein said first die, said second die and said third die are mounted on and electrically interconnected to a platform which is compatible with through-hole technology, and wherein said platform and said resonant tank are further assembled on a printed circuit board without a surface mount assembly process.

2. The power system of claim 1, wherein said platform comprises a printed-circuit-board-based platform.

3. The power system of claim 2, wherein said feedback circuit comprises a plurality of discrete components, and wherein said discrete components are mounted on said printed-circuit-board-based platform.

4. The power system of claim 1, wherein said platform comprises a substrate-based platform.

5. The power system of claim 4, wherein said feedback circuit comprises a plurality of discrete components, and wherein said discrete components are embedded in said substrate-based platform.

6. The power system of claim 1, wherein said load comprises a cold cathode fluorescent lamp.

7. The power system of claim 1, wherein said resonant tank comprises a transformer operable for generating said second AC signal.

8. A method comprising:
   integrating a controller circuit in a first die, wherein said controller is operable for controlling a switching circuit according to a feedback signal, and wherein said switching circuit is operable for providing a first AC signal and comprises a first switch and a second switch;
   integrating said first switch in a second die;
   integrating said second switch in a third die;
   electrically interconnecting said first die, said second die and said third die on a platform which is compatible with through-hole technology; and
   assembling said platform and a resonant tank on a printed circuit board without a surface mount assembly process, wherein said resonant tank is operable for transforming said first AC signal to a second AC signal for powering a load.

9. The method of claim 8, wherein said platform comprises a printed-circuit-board-based platform, and wherein said method further comprises:
   mounting a plurality of discrete components in a feedback circuit on said printed-circuit-board-based platform, wherein said feedback circuit monitors an electrical condition of said load and provides said feedback signal.

10. The method of claim 8, wherein said platform comprises a substrate-based platform, and wherein said method further comprises:
    embedding a plurality of discrete components in a feedback circuit in said substrate-based platform, wherein said feedback circuit monitors an electrical condition of said load and provides said feedback signal.

11. The method of claim 8, wherein said load comprises a cold cathode fluorescent lamp.

* * * * *